(12) United States Patent
Sung (10) Patent No.: US 11,508,894 B2
(45) Date of Patent: Nov. 22, 2022

(54) THERMOELECTRIC ELEMENT

(71) Applicant: LG INNOTEK CO., LTD., Seoul (KR)

(72) Inventor: Myoung Seok Sung, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 158 days.

(21) Appl. No.: 16/959,249

(22) PCT Filed: Jan. 17, 2019

(86) PCT No.: PCT/KR2019/000681
§ 371 (c)(1),
(2) Date: Jun. 30, 2020

(87) PCT Pub. No.: WO2019/143140
PCT Pub. Date: Jul. 25, 2019

(65) Prior Publication Data
US 2020/0335681 A1 Oct. 22, 2020

(30) Foreign Application Priority Data
Jan. 19, 2018 (KR) .................... 10-2018-0007116

(51) Int. Cl.
*H01L 35/32* (2006.01)
*H01L 35/16* (2006.01)
(Continued)

(52) U.S. Cl.
CPC .............. *H01L 35/32* (2013.01); *H01L 35/16* (2013.01); *H01L 35/34* (2013.01); *H01S 5/02216* (2013.01); *H01S 5/02415* (2013.01)

(58) Field of Classification Search
CPC ......... H01L 35/32; H01L 35/16; H01L 35/34; H01L 35/02; H01L 35/14; H01S 5/02216;
(Continued)

(56) References Cited

U.S. PATENT DOCUMENTS 3,615,870 A * 10/1971 Crouthamel ............ H01L 35/34
136/204
2003/0121540 A1* 7/2003 Onoue .................... H01L 35/32
136/212

(Continued)

FOREIGN PATENT DOCUMENTS

JP 2003318455 A * 11/2003
JP 2012-079803 4/2012
(Continued)

OTHER PUBLICATIONS

JP-2003318455-A, Machine Translation, Azuma (Year: 2003).*
(Continued)

*Primary Examiner* — Devina Pillay
(74) *Attorney, Agent, or Firm* — KED & Associates LLP (57) ABSTRACT

One embodiment discloses a thermoelectric element comprising: a first substrate; a plurality of thermoelectric legs disposed on the first substrate; a second substrate disposed on the plurality of thermoelectric legs above the first substrate; electrodes including a plurality of first electrodes disposed between the first substrate and the plurality of thermoelectric legs and a plurality of second electrodes disposed between the second substrate and the plurality of thermoelectric legs; and a first reinforcing part disposed on the lower surface and a portion of the side surface of the first substrate.

16 Claims, 9 Drawing Sheets

(51) Int. Cl.
  *H01L 35/34* (2006.01)
  *H01S 5/02216* (2021.01)
  *H01S 5/024* (2006.01)

(58) Field of Classification Search
  CPC ............. H01S 5/02415; H01S 5/02251; G02B 6/4271; G02B 6/4265
  See application file for complete search history.

(56) References Cited

U.S. PATENT DOCUMENTS

| | | | |
|---|---|---|---|
| 2010/0163090 A1* | 7/2010 | Liu | H01L 35/32 136/224 |
| 2012/0060887 A1 | 3/2012 | Kim et al. | |
| 2014/0345664 A1 | 11/2014 | Meyer et al. | |
| 2019/0044042 A1 | 2/2019 | Nakada et al. | |
| 2020/0006617 A1* | 1/2020 | Ogawa | H01L 23/36 |

FOREIGN PATENT DOCUMENTS

| | | | |
|---|---|---|---|
| JP | 2017-069555 | | 4/2017 |
| KR | 20110036152 A | * | 4/2011 |
| KR | 10-2012-0028687 | | 3/2012 |
| KR | 10-2013-0019883 | | 2/2013 |
| KR | 10-2014-0123484 | | 10/2014 |
| KR | 10-2016-0118747 | | 10/2016 |

OTHER PUBLICATIONS

KR20110036152A, Bae, Machine Translation (Year: 2011).*
Korean Office Action dated Sep. 14, 2021 issued in Application No. 10-2018-0007116.
International Search Report dated Apr. 12, 2019 issued in Application No. PCT/KR2019/000681.

* cited by examiner

THERMOELECTRIC ELEMENT

CROSS-REFERENCE TO RELATED PATENT APPLICATIONS

This application is a U.S. National Stage Application under 35 U.S.C. § 371 of PCT Application No. PCT/KR2019/000681, filed Jan. 17, 2019, which claims priority to Korean Patent Application No. 10-2018-0007116, filed Jan. 19, 2018, whose entire disclosures are hereby incorporated by reference.

TECHNICAL FIELD

The present invention relates to a thermoelectric element, and more particularly, to a thermoelectric element having a structure which allows occurrence of cracks and damage of a substrate to be prevented or significantly reduced.

BACKGROUND ART

A thermoelectric effect is a phenomenon caused due to movements of electrons and holes in a material and means direct energy conversion between heat and electricity.

A thermoelectric element is a generic term for a device which uses a thermoelectric effect and has a structure in which a P-type thermoelectric material and an N-type thermoelectric material are disposed between metal electrodes and bonded to form a pair of PN junctions.

The thermoelectric element may be classified into an element using a temperature variation in electrical resistance, an element using the Seebeck effect in which an electromotive force is generated due to a temperature difference, an element using the Peltier effect which is a phenomenon in which heat absorption or heat radiation occurs due to a current and the like.

Thermoelectric elements are widely applied to household appliances, electronic parts, and communication parts. For example, the thermoelectric elements may be applied to cooling devices, heating devices, power generation devices, and the like. Accordingly, the demand for thermoelectric performance of the thermoelectric elements is gradually increasing.

DISCLOSURE

Technical Problem

The present invention is directed to providing a thermoelectric element which allows occurrence of cracks and damage of a substrate to be prevented or significantly reduced.

Technical Solution

One aspect of the present invention provides a thermoelectric element including a first substrate, a plurality of thermoelectric legs disposed on the first substrate, a second substrate disposed on the plurality of thermoelectric legs on the first substrate, an electrode including a plurality of first electrodes disposed between the first substrate and the plurality of thermoelectric legs and a plurality of second electrodes disposed between the second substrate and the plurality of thermoelectric legs, and a first reinforcement disposed on a lower surface and a part of a side surface of the first substrate.

The thermoelectric element may further include a second reinforcement disposed on an upper surface and a part of a side surface of the second substrate.

The first reinforcement may include a lower surface reinforcement disposed on the lower surface of the first substrate, and a side surface reinforcement extending from the lower surface reinforcement and disposed on the side surface of the first substrate.

The side surface of the first substrate may include a long side surface and a short side surface, and a width of the long side surface may be less than or equal to a total width of the side surface reinforcement disposed on the long side surface.

The side surface of the first substrate may include the short side surface and the long side surface, and a width of the long side surface may be less than or equal to a total width of the side surface reinforcement disposed on the long side surface.

The side surface reinforcement may include a first side surface reinforcement disposed in a corner area formed by the short side surface and the long side surface of the first substrate, and a second side surface reinforcement disposed on the long side surface of the first substrate in a central portion in a width direction.

The lower surface reinforcement may include a first layer disposed on the lower surface of the first substrate, a second layer disposed on the first layer, and a third layer disposed on the second layer, and the side surface reinforcement may be formed of the first layer of the lower surface reinforcement.

The first layer may be made of copper, the second layer may be made of nickel, and the third layer may be made of gold.

A height of the first reinforcement may be 0.2 to 1.5 times a height of the first substrate.

The first reinforcement may include an upper surface reinforcement extending from the side surface reinforcement and disposed on an upper surface of the first substrate, and the upper surface reinforcement may be spaced apart from the plurality of thermoelectric legs and the electrode.

The thermoelectric element may further include an insulating member disposed between the upper surface reinforcement and the electrode.

Advantageous Effects

In accordance with the embodiments of the present invention, a thermoelectric element having excellent performance can be provided.

In particular, in accordance with the embodiment of the present invention, it is possible to prevent or significantly reduce occurrence of cracks and damage of a substrate.

In addition, in accordance with the embodiments of the present invention, a thermoelectric element with improved heat transfer efficiency can be provided.

DESCRIPTION OF DRAWINGS

FIGS. 11(*a*) to 13(*c*) are diagrams illustrating an example of a thermoelectric leg of the thermoelectric element according to an embodiment of the present invention.

MODES OF THE INVENTION

The present invention may be modified into various forms and may have a variety of embodiments, and, therefore, specific embodiments will be illustrated in the accompanying drawings and described. The embodiments, however, are not to be taken in a sense which limits the present invention to the specific embodiments and should be construed to include modifications, equivalents, or substituents within the spirit and technical scope of the present invention.

Terms including ordinal numbers such as first, second, and the like used herein may be used to describe various components, but the various components are not limited by these terms. The terms are used only for the purpose of distinguishing one component from another component. For example, without departing from the scope of the present invention, a second component may be referred to as a first component, and similarly, a first component may also be referred to as a second component. The term "and/or" includes a combination of a plurality of related listed items or any one item of the plurality of related listed items.

When a component is referred to as being "connected," or "coupled" to another component, it may be directly connected or coupled to another component, but it should be understood that sill another component may be present between the component and another component. On the contrary, when a component is referred to as being "directly connected," or "directly coupled" to another, it should be understood that yet another component may not be present between the component and another component.

The terms used herein are employed to describe only specific embodiments and are not intended to limit the present invention. Unless the context clearly dictates otherwise, the singular form includes the plural form. It should be understood that the terms "comprise," "include," and "have" specify the presence of stated herein features, numbers, steps, operations, components, elements, or combinations thereof, but do not preclude the presence or possibility of adding one or more other features, numbers, steps, operations, components, elements, or combinations thereof.

Unless otherwise defined, all terms including technical or scientific terms used herein have the same meaning as commonly understood by those skilled in the art to which the present invention pertains. General terms that are defined in a dictionary should be construed as having meanings that are consistent in the context of the relevant art and are not to be interpreted as having an idealistic or excessively formalistic meaning unless clearly defined in the present application.

Hereinafter, embodiments of the present invention will be described in detail with reference to the drawings, the same reference numerals are given to the same or corresponding components regardless of a number of the drawing, and a duplicate description thereof will be omitted.

Figure 1:
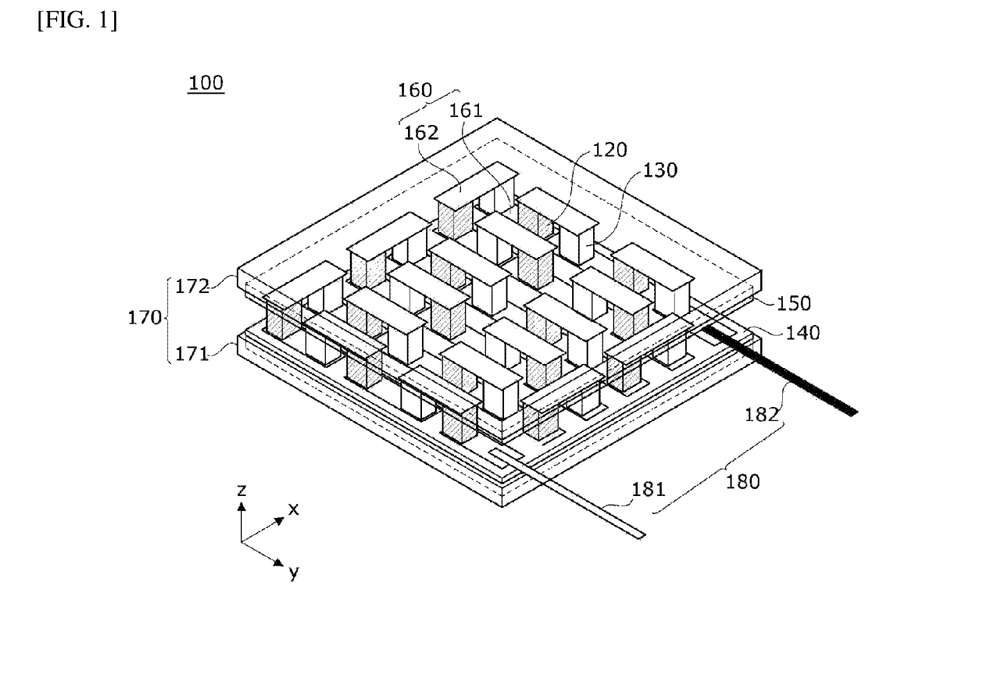
FIG. 1 is a perspective view illustrating a thermoelectric element according to one embodiment of the present invention.
Figure 2:
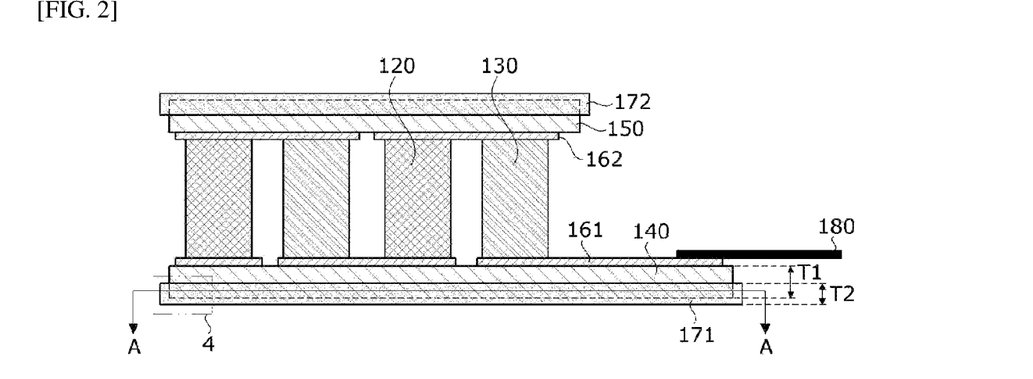
FIG. 2 is a side view illustrating the thermoelectric element according to one embodiment of the present invention.
Figure 3:
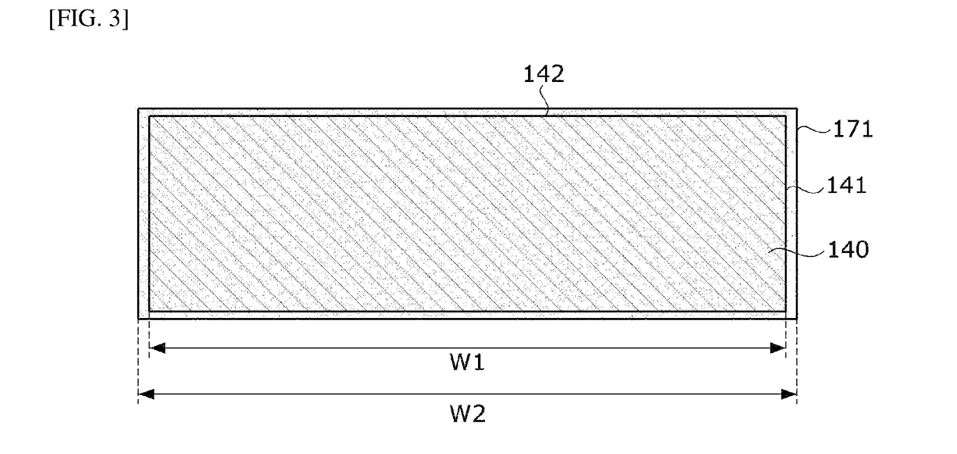
FIG. 3 is a cross-sectional view taken along line A-A of FIG. 2.
Figure 4:
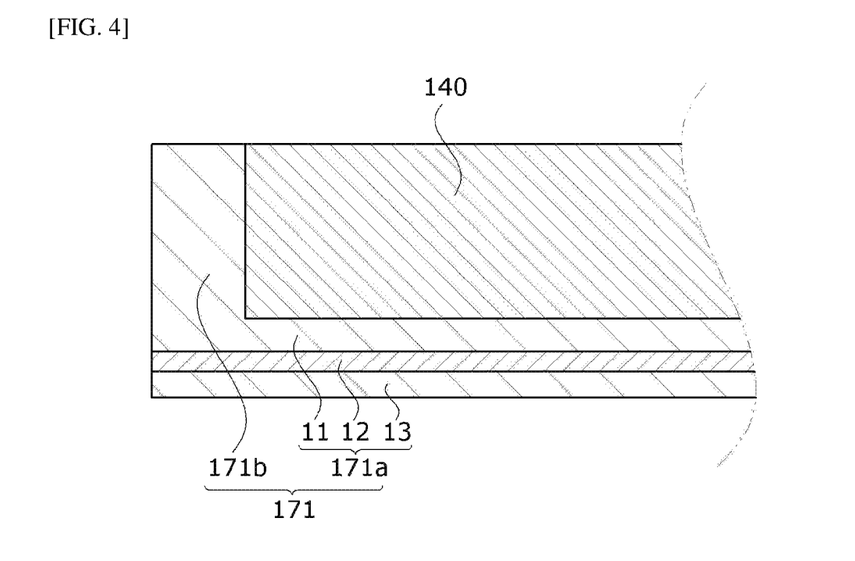
FIG. 4 is an enlarged view of Portion 4 of FIG. 2.

FIG. 1 is a perspective view illustrating a thermoelectric element according to one embodiment of the present invention, FIG. 2 is a side view illustrating the thermoelectric element according to one embodiment of the present invention, FIG. 3 is a cross-sectional view taken along line A-A of FIG. 2, and FIG. 4 is an enlarged view of Portion 4 of FIG. 2.

Referring to FIGS. 1 to 4, a thermoelectric element 100 according to one embodiment of the present invention includes a P-type thermoelectric leg 120, an N-type thermoelectric leg 130, a lower substrate 140, an upper substrate 150, a reinforcement 170, an electrode 160, and a lead line 180.

The electrode 160 includes a first electrode 161 and a second electrode 162, the lead line 180 includes a first lead line 181 connected to the first electrode 161 and a second lead line 182 connected to the second electrode 162.

The lower electrode 161 is disposed between the lower substrate 140 and lower bottom surfaces of the P-type thermoelectric leg 120 and the N-type thermoelectric leg 130, and the upper electrode 162 is disposed between the upper substrate 150 and upper bottom surfaces of the P-type thermoelectric leg 120 and the N-type thermoelectric leg 130. Accordingly, a plurality of P-type thermoelectric legs 120 and a plurality of N-type thermoelectric legs 130 are electrically connected by the lower electrode 161 and the upper electrode 162. A pair of the P-type thermoelectric leg 120 and the N-type thermoelectric leg 130, which are disposed between the lower electrode 161 and the upper electrode 162 and electrically connected to each other, may form a unit cell.

For example, when voltages are applied to the lower electrode 161 and the upper electrode 162 through the first and second lead lines 181 and 182, a substrate in which a current flows from the P-type thermoelectric leg 120 to the N-type thermoelectric leg 130 due to the Peltier effect may absorb heat to serve as a heat absorption part, and a substrate in which a current flows from the N-type thermoelectric leg 130 to the P-type thermoelectric leg 120 may be heated to serve as a heat radiation part.

Here, each of the P-type thermoelectric leg 120 and the N-type thermoelectric leg 130 may be a bismuth telluride (Bi—Te)-based thermoelectric leg containing Bi and Te as main raw materials. The P-type thermoelectric leg 120 at 100 wt % may be a thermoelectric leg which includes 99 to 99.999 wt % Bi—Te-based main low material containing at least one among antimony (Sb), nickel (Ni), Al, Cu, silver (Ag), lead (Pb), boron (B), gallium (Ga), Te, Bi, and indium (In) and includes 0.001 to 1 wt % mixture containing Bi or Te. For example, the P-type thermoelectric leg 120 at 100 wt % may include Bi—Se—Te as the main raw material and may further include 0.001 to 1 wt % Bi or Te. The N-type thermoelectric leg 130 at 100 wt % may be a thermoelectric leg which includes 99 to 99.999 wt % Bi—Te-based low material containing at least one among selenium (Se), Ni, Al, Cu, Ag, Pb, B, Ga, Te, Bi, and In and includes 0.001 to 1 wt % mixture containing Bi or Te. For example, the N-type thermoelectric leg 130 at 100 wt % may include Bi—Sb—Te as the main raw material and may further include 0.001 to 1 wt % Bi or Te.

Each of the P-type thermoelectric leg 120 and the N-type thermoelectric leg 130 may be formed in a bulk shape or a stacked shape. Generally, a bulk-shaped P-type thermoelectric leg 120 or a bulk-shaped N-type thermoelectric leg 130 may be obtained by heat-treating a thermoelectric material to produce an ingot, crushing and sieving the ingot to obtain a thermoelectric leg powder, sintering the thermoelectric leg powder, and cutting the sintered body. A stack-shaped P-type thermoelectric leg 120 or a stack-shaped N-type thermoelectric leg 130 may be obtained by applying a paste containing a thermoelectric material on a sheet-shaped substrate to form a unit member, stacking unit members, and cutting the stacked unit members.

In this case, the pair of the P-type thermoelectric leg 120 and the N-type thermoelectric leg 130 may have the same shape and height or may have different shapes and volumes. For example, since electrical conductivity characteristics of the P-type thermoelectric leg 120 and the N-type thermoelectric leg 130 are different, a cross-sectional area of the N-type thermoelectric leg 130 may be formed differently from that of the P-type thermoelectric leg 120.

Performance of the thermoelectric element according to one embodiment of the present invention may be represented by a thermoelectric figure of merit ZT. The thermoelectric figure of merit ZT may be expressed by Equation 1.

$$ZT = \alpha^2 \sigma T/k \tag{1}$$

Here, $\alpha$ is a Seebeck coefficient (V/K), $\sigma$ is electrical conductivity (S/m), and $\alpha^2\sigma$ is a power factor (W/mK2). Further, T is a temperature, and k is thermal conductivity (W/mK). k may be expressed as $a \cdot cp \cdot \rho$, a is thermal diffusivity (cm2/S), cp is a specific heat (J/gK), and $\rho$ is a density (g/cm3).

In order to obtain a figure of merit ZT of the thermoelectric element, a Z value (V/K) is measured using a Z-meter, and the figure of merit ZT may be calculated using the measured Z value.

Here, the lower electrode 120 disposed between the lower substrate 140, the P-type thermoelectric leg 120, and the N-type thermoelectric leg 130, and the upper electrode 162 disposed between the upper substrate 150, the P-type thermoelectric leg 120, and the N-type thermoelectric leg 130 may each include at least one among Cu, Ag, and Ni.

In addition, the lower substrate 140 and the upper substrate 150 opposite to each other may be insulating substrates or metal substrates. The insulating substrate may be an alumina substrate or a polymer resin substrate having flexibility. The polymer resin substrate having flexibility may include various insulating resin materials such as high permeability plastic and the like such as polyimide (PI), polystyrene (PS), polymethyl methacrylate (PMMA), cyclic olefin copoly (COC), polyethylene terephthalate (PET), and a resin. Alternatively, the insulating substrate may be a fabric. The metal substrate may include Cu, a Cu alloy, or a Cu—Al alloy. In addition, when the lower substrate 140 and the upper substrate 150 are metal substrates, a dielectric layer may further be formed between the lower substrate 140 and the lower electrode 161 and between the upper substrate 150 and the upper electrode 162. The dielectric layer may include a material having thermal conductivity ranging from 5 to 10 W/mK.

In this case, sizes of the lower substrate 140 and the upper substrate 150 may be formed to be different from each other. For example, a volume, a thickness, or an area of one of the lower substrate 140 and the upper substrate 150 may be formed to be larger than that of the other one thereof. Consequently, heat absorption performance or heat radiation performance of the thermoelectric element may be improved.

The plurality of lower electrodes 161 and the plurality of upper electrodes 162 may each be disposed in the form of an m*n array (here, each of m and n may be an integer of one or more, and m and n may be the same or different from each other), but the present invention is not limited thereto. The lower electrode 161 and the upper electrode 162 may each be disposed to be spaced apart from another lower electrode 161 and another upper electrode 162 which are adjacent thereto. For example, the lower electrode 161 and the upper electrode 162 may be disposed to be spaced approximately 0.5 mm to 0.8 mm from another lower electrode 161 and another upper electrode 262 which are adjacent thereto.

In addition, a pair of the P-type thermoelectric leg 120 and the N-type thermoelectric leg 130 are disposed on the lower electrode 161, and the pair of the P-type thermoelectric leg 120 and the N-type thermoelectric leg 130 are disposed below the upper electrode 162.

That is, a bottom surface of the P-type thermoelectric leg 120 may be disposed on the lower electrode 161 and a top surface thereof may be disposed on the upper electrode 162, and a bottom surface of the N-type thermoelectric leg 130 may be disposed on the lower electrode 161 and a top surface thereof may be disposed on the upper electrode 162. When the P-type thermoelectric leg 120 of the pair of the P-type thermoelectric leg 120 and the N-type thermoelectric leg 130 which are disposed on the lower electrode 161 is disposed on one lower electrode 161 among the plurality of lower electrodes 162, the N-type thermoelectric leg 130 may be disposed on another lower electrode 162 adjacent to the one lower electrode 161. Accordingly, the plurality of P-type thermoelectric legs 120 and the plurality of N-type thermoelectric legs 130 are electrically connected in series through the lower electrodes 161 and the lower electrodes 162.

In this case, a pair of lower solder layers may be applied on the lower electrode 161 to bond the pair of the P-type thermoelectric leg 120 and the N-type thermoelectric leg 130, and the pair of the P-type thermoelectric leg 120 and the N-type thermoelectric leg 130 may be disposed on the pair of lower solder layers.

The reinforcement 170 includes a lower reinforcement 171 disposed below the lower substrate 140, and an upper reinforcement 172 disposed below the upper substrate 150.

Here, the reinforcement 170 may be disposed on the lower substrate 140 and the upper substrate 150 by a process such as electroplating or thermal spraying.

Meanwhile, the lower substrate 140 may have a rectangular shape and may include a pair of short side surfaces 141 facing each other and a pair of long side surfaces 142 facing each other.

Here, each of the long side surfaces 142 has a first width W1.

The lower reinforcement 171 may include a lower surface reinforcement 171a disposed on a lower surface of the lower substrate 140, and a side surface reinforcement 171b disposed on the short side surface 141 and the long side surface 142 of the lower substrate 140.

Here, the upper reinforcement 172 may also include an upper surface reinforcement disposed on an upper surface of the upper substrate 150, and a side surface reinforcement disposed on a short side surface and a long side surface of the upper substrate 150.

However, hereinafter, one embodiment of the present invention will be described through the lower reinforcement 171 disposed on the lower substrate 140.

A height T2 of the side surface reinforcement 171b of the lower reinforcement 171 may be smaller than or equal to a height T1 of the lower substrate 140.

Meanwhile, the height T2 of the side surface reinforcement 171b of the lower reinforcement 171 may be formed to be 0.2 to 1.5 times the height T1 of the lower substrate 140.

Here, when the height T2 of the side surface reinforcement 171b of the lower reinforcement 171 is less than 0.2 times the height T1 of the lower substrate 140, an external force transmitted to the lower substrate 140 cannot be suppressed. When the height T2 of the side surface reinforcement 171b of the lower reinforcement 171 exceeds 1.5 times the height T1 of the lower substrate 140, the side surface reinforcement 171b is formed more than necessary, and thus the P-type thermoelectric leg 120 and the N-type thermoelectric leg 130 may be unnecessarily in contact with the side surface reinforcement 171b such that an electrical short circuit may occur between the P-type thermoelectric leg 120 and the N-type thermoelectric leg 130.

In addition, it is preferable that the height T2 of the side surface reinforcement 171b of the lower reinforcement 171 is formed to be 0.2 to 1 times the height T1 of the lower substrate 140. Further, it is more preferable that the height T2 of the side surface reinforcement 171b of the lower reinforcement 171 is formed to be 0.2 times to 0.8 times the height T1 of the lower substrate 140.

Further, a width W2 of the side surface reinforcement 171b of the lower reinforcement 171 may be larger than or equal to the width W1 of the long side surface 142 of the lower substrate 140.

That is, the side surface reinforcement 171b may fully cover the long side surface 142 of the lower substrate 140 in a width direction. Here, the side surface reinforcement 171b fully covering the long side surface 142 of the lower substrate 140 may mean that the side surface reinforcement 171b is disposed on the entire long side surface 142 of the lower substrate 140 in the width direction based on the same height.

Meanwhile, referring to FIG. 4, the lower surface reinforcement 171a may include a plurality of metal layers.

The plurality of metal layers includes a first layer 11, a second layer 12, and a third layer 13.

The first layer 11 may be disposed on the lower surface of the lower substrate 140 and may include a first metal which is economical and advantageous to form a thickness.

The second layer 12 may be disposed on the first layer 11 and may include a second metal which improves adhesion between the first layer 11 and the third layer 13.

The third layer 13 may be disposed on the second layer 12 and may include a third metal which is excellent in anti-oxidation and which is easy to bond to an external device.

For example, the first metal may include Cu, the second metal may include Ni, and the third metal may include gold.

Here, the first layer 11 may occupy a volume of about 95% in the plurality of metal layers, the second layer 12 may occupy a volume of about 10% therein, and the third layer 13 may occupy a volume of about 1% therein.

Meanwhile, the side surface reinforcement 171b may be formed of only a first layer which is not bonded to an external device and is made of a first metal, such as Cu, such that heat exchange with the lower substrate 140 is excellent.

Hereinafter, a thermoelectric element according to another embodiment of the present invention will be described with reference to FIGS. 5 and 6.

Figure 5:
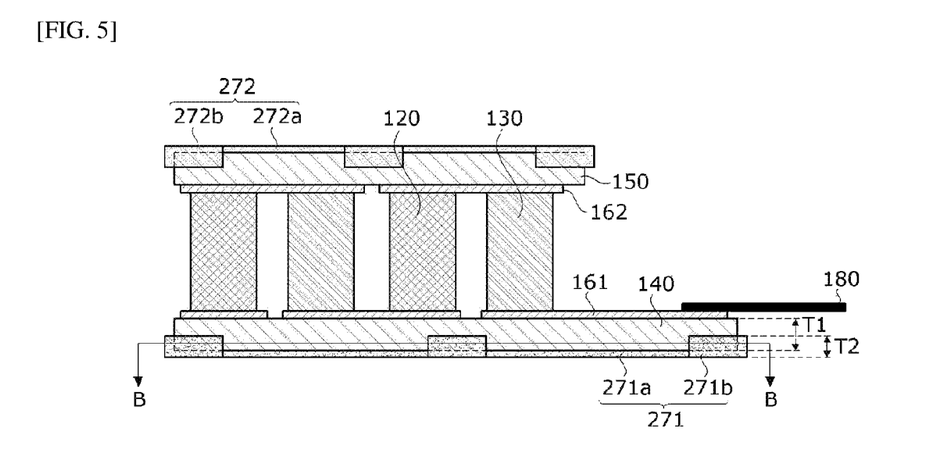
FIG. 5 is a side view illustrating a thermoelectric element according to another embodiment of the present invention.
Figure 6:
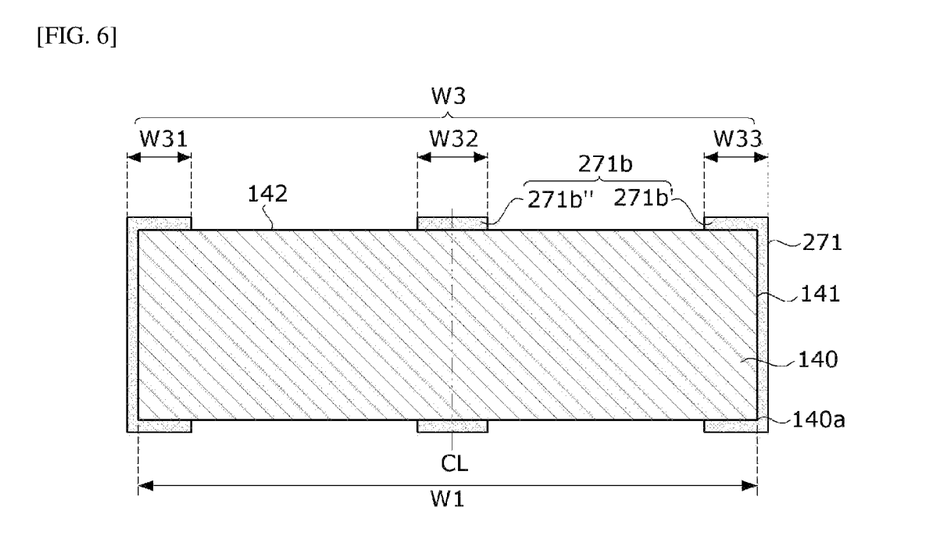
FIG. 6 is a cross-sectional view taken along line B-B of FIG. 5.

FIG. 5 is a side view illustrating a thermoelectric element according to another embodiment of the present invention, and FIG. 6 is a cross-sectional view taken along line B-B of FIG. 5.

Referring to FIGS. 5 and 6, as compared with the thermoelectric element according to one embodiment of the present invention shown in FIG. 2, the thermoelectric element according to another embodiment of the present invention has a different configuration of a reinforcement 270. Thus, hereinafter, only the different configuration of the reinforcement 270 will be described in detail, and detailed descriptions of the same components having the overlapping reference numerals will be omitted herein.

The reinforcement 270 includes a lower reinforcement 271 disposed below the lower substrate 140 and an upper reinforcement 272 disposed below the upper substrate 150.

Here, the reinforcement 270 may be disposed on the lower substrate 140 and the upper substrate 150 by a process such as electroplating or thermal spraying.

The lower reinforcement 271 includes a lower surface reinforcement 271a disposed on a lower surface of the lower substrate 140, and a side surface reinforcement 271b disposed on a short side surface 141 and a long side surface 142 of the lower substrate 140.

Here, the upper reinforcement 272 may also include an upper surface reinforcement disposed on an upper surface of the upper substrate 150, and a side surface reinforcement disposed on a short side surface and a long side surface of the upper substrate 150.

However, hereinafter, another embodiment of the present invention will be described through the lower reinforcement 271 disposed on the lower substrate 140.

A height T2 of the side surface reinforcement 271b of the lower reinforcement 271 may be smaller than or equal to a height T1 of the lower substrate 140.

Meanwhile, the height T2 of the side surface reinforcement 271b of the lower reinforcement 271 may be formed to be 0.2 to 1.5 times the height T1 of the lower substrate 140.

Here, when the height T2 of the side surface reinforcement 271b of the lower reinforcement 271 is less than 0.2 times the height T1 of the lower substrate 140, an external force transmitted to the lower substrate 140 cannot be suppressed. When the height T2 of the side surface reinforcement 271b of the lower reinforcement 271 exceeds 1.5 times the height T1 of the lower substrate 140, the side surface reinforcement 271b is formed more than necessary, and thus the P-type thermoelectric leg 120 and the N-type thermoelectric leg 130 may be unnecessarily in contact with the side surface reinforcement 271b so that an electrical short circuit may occur between the P-type thermoelectric leg 120 and the N-type thermoelectric leg 130.

In addition, it is preferable that the height T2 of the side surface reinforcement 271b of the lower reinforcement 271 is formed to be 0.2 to 1 times the height T1 of the lower substrate 140. It is more preferable that the height T2 of the side surface reinforcement 271b of the lower reinforcement 271 is formed to be 0.2 times to 0.8 times the height T1 of the lower substrate 140.

Meanwhile, the side surface reinforcement 271b of the lower reinforcement 271 includes a first side surface reinforcement 271b' and a second side surface reinforcement 271b".

The first side surface reinforcement 271b' is disposed in a corner area 140a formed by the long side surface 142 and the short side surface 141 of the lower substrate 140. Here, the first side surface reinforcement 271b' is disposed on a portion of the long side surface 142 and the short side surface 141 in the corner area 140*a* and has a substantial "☐" shape.

The second side surface reinforcement 271*b*" is disposed in a central portion having a predetermined range from a center CL of the long side surface 142 of the lower substrate 140 to one side and the other side in the width direction.

Here, the side surface reinforcement 271*b* has widths W31 and W33 of the first side surface reinforcements 271*b*' and a width W32 of the second side surface reinforcement 271*b*" as an overall width W3 in the width direction.

Meanwhile, since the first side surface reinforcements 271*b*' are disposed to be spaced apart from the second side surface reinforcement 271*b*", the overall width W3 of the side surface reinforcement 271*b* may be smaller than a width W1 of the long side surface 142 of the lower substrate 140.

That is, the side surface reinforcement 271*b* may cover the long side surface 142 of the lower substrate 140 except for a portion of the long side surface 142 in a width direction.

Hereinafter, a thermoelectric element according to still another embodiment of the present invention will be described with reference to FIGS. 7 and 8.

Figure 7:
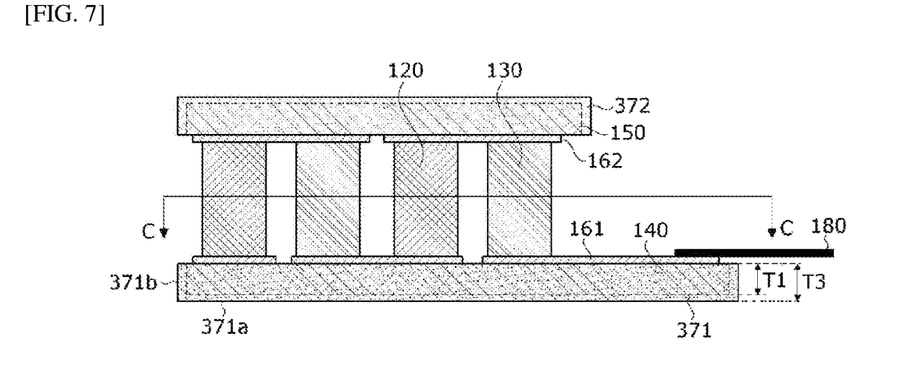
FIG. 7 is a cross-sectional view illustrating a thermoelectric element according to still another embodiment of the present invention.
Figure 8:
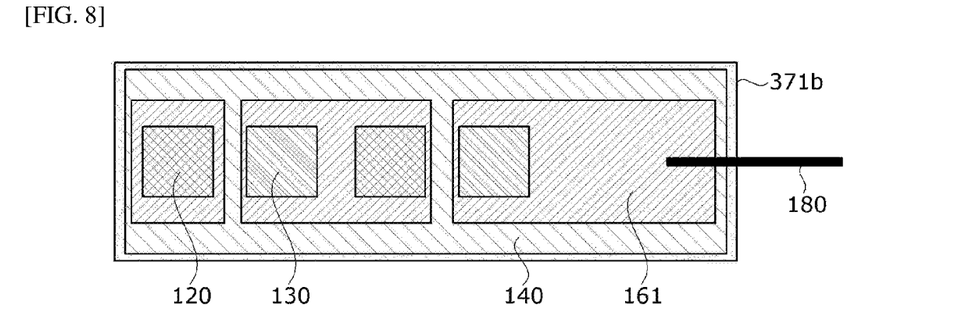
FIG. 8 is a cross-sectional view taken along line C-C of FIG. 7.

FIG. 7 is a cross-sectional view illustrating a thermoelectric element according to still another embodiment of the present invention, and FIG. 8 is a cross-sectional view taken along line C-C of FIG. 7.

Referring to FIGS. 7 and 8, as compared with the thermoelectric element according to one embodiment of the present invention shown in FIG. 2, the thermoelectric element according to still another embodiment of the present invention has a different configuration of a reinforcement 370. Thus, hereinafter, only the different configuration of the reinforcement 370 will be described in detail, and detailed descriptions of the same components having the overlapping reference numerals will be omitted herein.

The reinforcement 370 includes a lower reinforcement 371 disposed below a lower substrate 140 and an upper reinforcement 372 disposed below an upper substrate 150.

Here, the reinforcement 370 may be disposed on the lower substrate 140 and the upper substrate 150 by a process such as electroplating or thermal spraying.

The lower reinforcement 371 includes a lower surface reinforcement 371*a* disposed on a lower surface of the lower substrate 140, and a side surface reinforcement 371*b* disposed on a short side surface 141 and a long side surface 142 of the lower substrate 140

Here, the upper reinforcement 372 may also include an upper surface reinforcement disposed on an upper surface of the upper substrate 150, and a side surface reinforcement disposed on a short side surface and a long side surface of the upper substrate 150.

However, hereinafter, still another embodiment of the present invention will be described through the lower reinforcement 371 disposed on the lower substrate 140.

A height T3 of the side surface reinforcement 371*b* of the lower reinforcement 371 may be greater than a height T1 of the lower substrate 140, and an upper surface of the lower substrate 140 may be coplanar with an upper surface of the side surface reinforcement 371*b*.

That is, the side surface reinforcement 371*b* may fully cover the long side surface 142 of the lower substrate 140 in a width direction and a height direction. Here, it means that a side surface reinforcement 371*b* is disposed on all side surfaces of the long side surface 142 of the lower substrate 140.

Meanwhile, it is preferable that the side surface reinforcement 371*b* of the lower reinforcement 371 is spaced apart from and is not in contact with a P-type thermoelectric leg 120, an N-type thermoelectric leg 130, a first electrode 161, a second electrode 162, a first lead line 181, and a second lead line 182, or an insulating member (not shown) is disposed therebetween.

That is, in the thermoelectric element according to still another embodiment of the present invention, since the lower reinforcement 371 is disposed to surround all of the lower surface and the side surfaces of the lower substrate 140, the lower substrate 140 may be prevented from being deformed and damaged due to an external force.

Hereinafter, a thermoelectric element according to yet another embodiment of the present invention will be described with reference to FIGS. 9 and 10.

Figure 9:
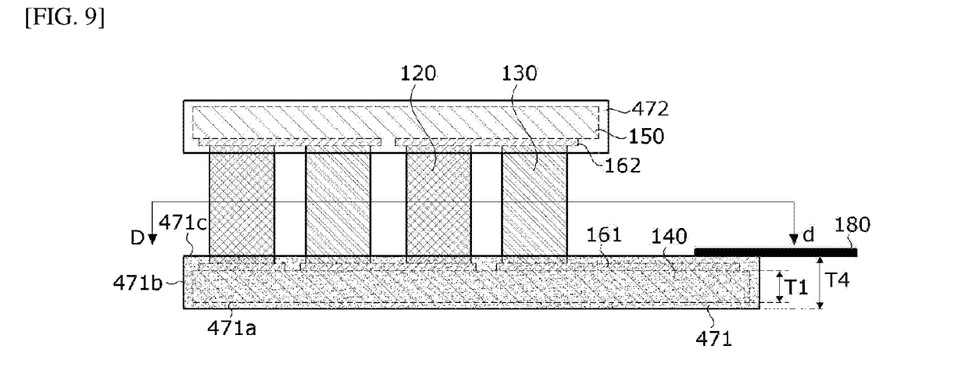
FIG. 9 is a side view illustrating a thermoelectric element according to yet another embodiment of the present invention.
Figure 10:
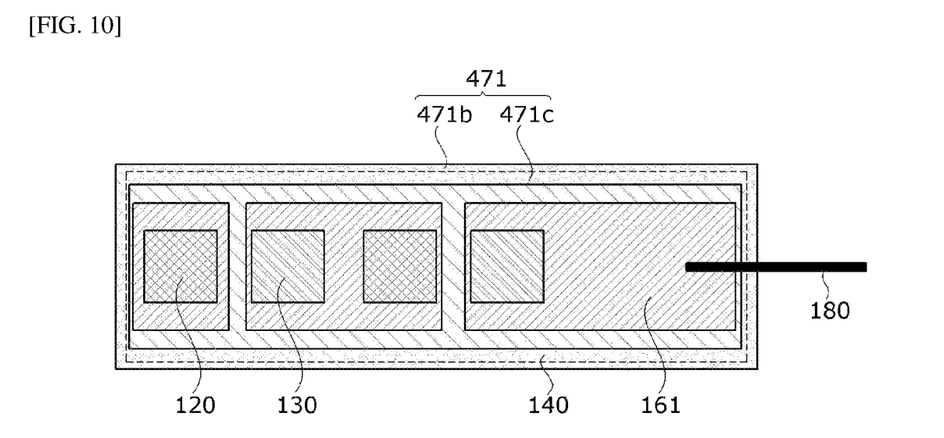
FIG. 10 is a cross-sectional view taken along line D-D of FIG. 9.

FIG. 9 is a side view illustrating a thermoelectric element according to yet another embodiment of the present invention, and FIG. 10 is a cross-sectional view taken along line D-D of FIG. 9.

Referring to FIGS. 9 and 10, as compared with the thermoelectric element according to one embodiment of the present invention shown in FIG. 2, the thermoelectric element according to yet another embodiment of the present invention has a different configuration of a reinforcement 470. Thus, hereinafter, only the different configuration of the reinforcement 470 will be described in detail, and detailed descriptions of the same components having the overlapping reference numerals will be omitted herein.

The reinforcement 470 includes a lower reinforcement 471 disposed below a lower substrate 140 and an upper reinforcement 472 disposed below an upper substrate 150.

Here, the reinforcement 470 may be disposed on the lower substrate 140 and the upper substrate 150 by a process such as electroplating or thermal spraying.

The lower reinforcement 471 includes a lower surface reinforcement 471*a* disposed on a lower surface of the lower substrate 140, a side surface reinforcement 471*b* disposed on a short side surface 141 and a long side surface 142 of the lower substrate 140, and an upper surface reinforcement 471*c* disposed on a portion of an upper surface of the lower substrate 140.

Here, the upper reinforcement 472 may also include an upper surface reinforcement disposed on an upper surface of the upper substrate 150, a side surface reinforcement disposed on a short side surface and a long side surface of the upper substrate 150, and a lower surface reinforcement disposed on a portion of a lower surface of the upper substrate 150.

However, hereinafter, still another embodiment of the present invention will be described through the lower reinforcement 471 disposed on the lower substrate 140.

A height T4 of the side surface reinforcement 471*b* of the lower reinforcement 471 may be greater than a height T1 of the lower substrate 140, and an upper surface of the side surface reinforcement 471*b* may be disposed at a higher level than the upper surface of the lower substrate 140.

That is, the side surface reinforcement 471*b* may fully cover the long side surface 142 of the lower substrate 140 in a width direction and a height direction. Here, it means that a side surface reinforcement 471*b* is disposed on all side surfaces of the long side surface 142 of the lower substrate 140.

The upper surface reinforcement 471*c* may extend from an end portion of the side surface reinforcement 471*b* and cover the portion of the upper surface of the lower substrate 140. Here, it is preferable that the upper surface reinforcement 471c of the lower reinforcement 471 is spaced apart from and is not in contact with a P-type thermoelectric leg 120, an N-type thermoelectric leg 130, a first electrode 161, a second electrode 162, a first lead line 181, and a second lead line 182, or an insulating member (not shown) is disposed therebetween.

That is, in the thermoelectric element according to yet another embodiment of the present invention, since the lower reinforcement 471 is disposed to surround all of the lower surface, the side surfaces, and the portion of the upper surface of the lower substrate 140, the lower substrate 140 may be prevented from being deformed and damaged due to an external force.

Hereinafter, an example of a thermoelectric leg of the thermoelectric element according to an embodiment of the present invention will be described with reference to FIGS. 11 to 13.

Figure 13A:
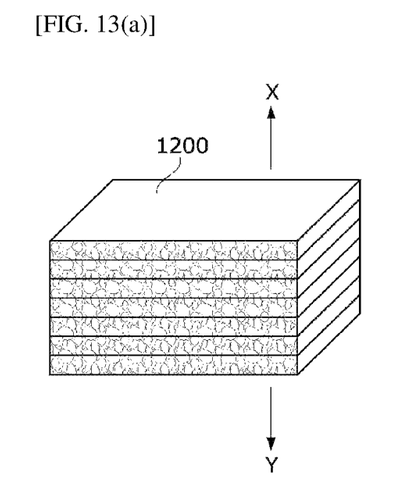
Figure 13B:
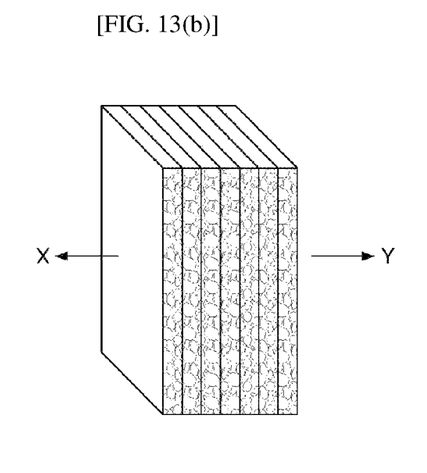
Figure 13C:
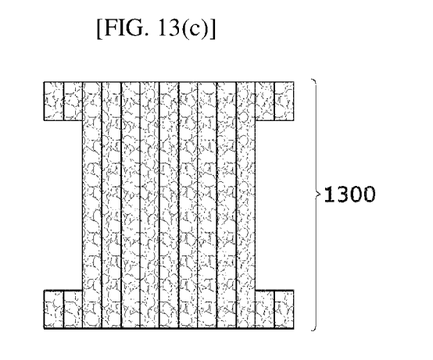

FIGS. 11 to 13 are diagrams illustrating an example of a thermoelectric leg of the thermoelectric element according to another embodiment of the present invention.

In another embodiment of the present invention, a structure of the above-described thermoelectric leg may be implemented as a structure having a stacked structure instead of a bulk structure, thereby further improving thinness and cooling efficiency.

Specifically, a structure of each of the P-type thermoelectric leg 120 and the N-type thermoelectric leg in FIG. 11 is formed such that a plurality of structures, each of which is formed by applying a semiconductor material on a sheet-shaped substrate, are stacked to form a unit member, and then the unit member is cut. Thus, it is possible to prevent material loss and improve an electrical conductivity characteristic.

In this regard, referring to FIG. 11, FIG. 11 illustrates a conceptual diagram of a process of manufacturing a unit member having the above-described stacked structure.

Referring to FIG. 11, a material including a semiconductor material is prepared in the form of a paste, and the paste is applied on a base substrate 1110 such as a sheet, a film, or the like to form a semiconductor layer 1120 so that one unit member 1100 is formed. As shown in FIG. 11, the unit member 1100 is formed as a stacked structure by stacking a plurality of unit members 1100a, 1100b, and 1100c, and then the stacked structure is cut to form a unit thermoelectric element 1200. That is, the unit thermoelectric element 1200 according to the present invention may be formed in a structure in which a plurality of unit members 1100, in each of which the semiconductor layer 1120 is stacked on the base substrate 1110, are stacked.

Figure 11A:
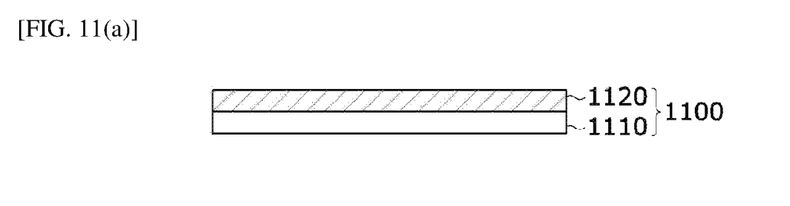

In the above-described process, the application of the semiconductor paste on the base substrate 1110 may be implemented using various methods. For example, the application of the semiconductor paste may be implemented by tape casting, that is, by a process of mixing a very fine semiconductor material powder with an aqueous or non-aqueous solvent and any one selected from a binder, a plasticizer, a dispersant, a defoamer, and a surfactant to prepare a slurry and then forming the slurry on a moving blade or a moving carrier substrate according to a purpose with a predetermined thickness. In this case, a material, such as a film, a sheet, or the like, having a thickness in the range of 10 μm to 100 μm may be used as the base substrate, and the P-type material and the N-type material for forming the above-described bulk-type element may also be directly applied as the semiconductor material being applied.

Figure 11B:
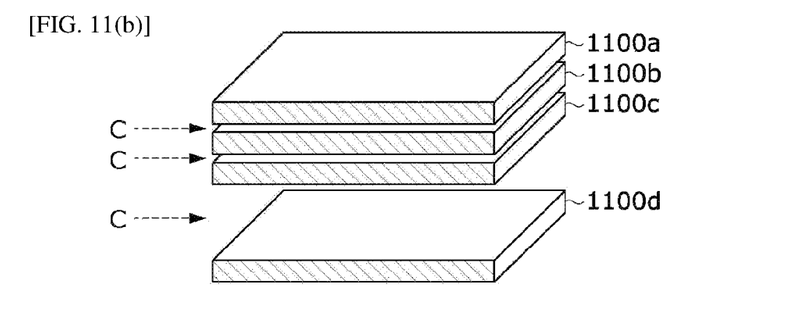
Figure 11C:
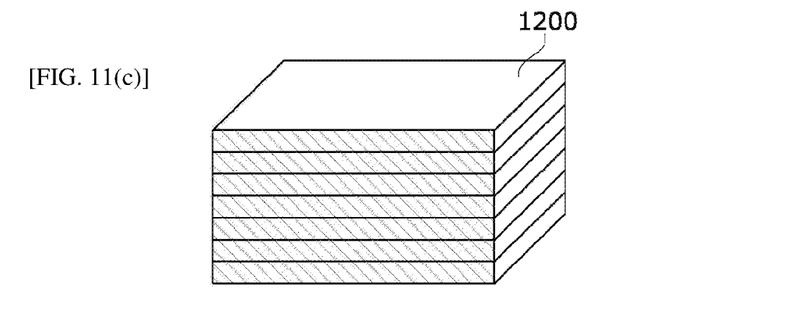
Figure 11D:
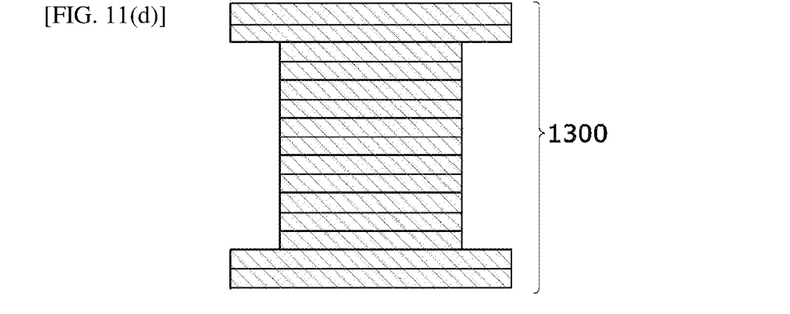
Figure 12A:
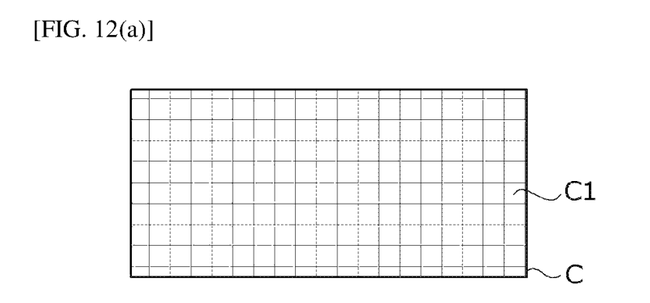
Figure 12B:
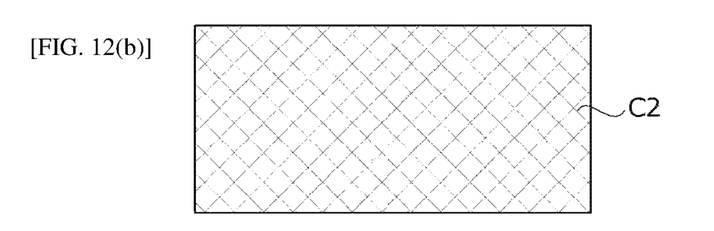
Figure 12C:
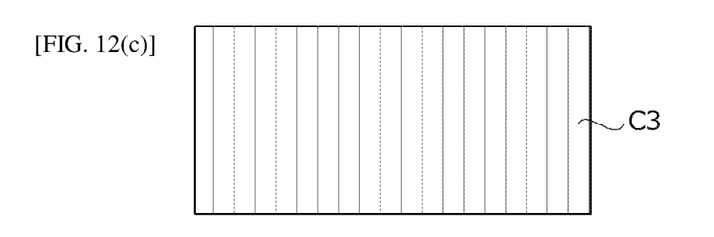
Figure 12D:
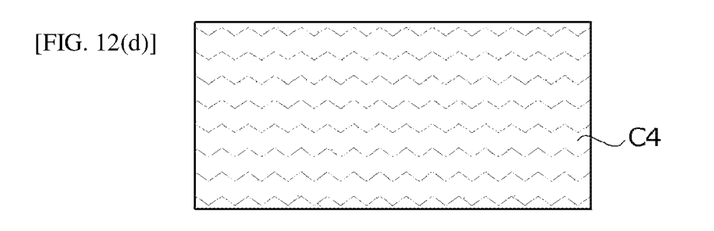

The unit members 1100 may be formed in a stacked structure by being compressed at a temperature ranging from 50° C. to 250° C. through the process of arranging and stacking the unit members 1100 in a multilayer. In the embodiment of the present invention, the number of the stacked unit members 1100 may range from two to fifty.

Thereafter, a cutting process may be performed in a desired shape and size, and a sintering process may be added.

A unit thermoelectric element formed by stacking the plurality of unit members 1100 manufactured according to the above-described processes may secure uniformity in thickness, shape, and size. That is, the existing bulk-shaped thermoelectric element is manufactured by pulverizing an ingot, finely ball-milling the pulverized ingot, and cutting a sintered bulk structure. Thus, there is a problem in that a great deal of material is lost, cutting in a uniform size is difficult, and achieving thinness is difficult due to a thick thickness ranging from 3 mm to 5 mm. The unit thermoelectric element having the stacked structure according to the embodiments of the present invention is manufactured by stacking the sheet-shaped unit members in a multilayer and cutting the sheet-shaped stacked structure. Thus, a material is hardly lost and has a uniform thickness so that uniformity of the material may be secured, a thickness of the entire unit thermoelectric element may be reduced to 1.5 mm or less to achieve thinness, and the unit thermoelectric element may be applied in various shapes. Like the structure of the above-described thermoelectric leg according to one embodiment of the present invention in FIG. 1, the finally implemented structure may be implemented by being cut into a regular hexahedral structure or a rectangular parallelepiped structure.

In particular, in the manufacturing process of the unit thermoelectric element according to another embodiment of the present invention, during the process of forming the stacked structure of the unit member 1100, the manufacturing process may be implemented to further include a process of forming a conductive layer on a surface of each unit member 1100.

That is, a conductive layer having a structure of FIG. 12 may be formed between the unit members of the stacked structure in FIG. 11C. The conductive layer may be formed on a surface opposite to a surface of the base substrate on which the semiconductor layer is formed. In this case, the conductive layer may be formed as a patterned layer to form a region in which the surface of the unit member is exposed. As compared with a case in which the conductive layer is applied on the entire surface of the base substrate, it is possible to realize an advantage of increasing electrical conductivity, improving adhesion strength between unit members, and reducing thermal conductivity.

That is, FIG. 12 illustrates various modified examples of a conductive layer C according to an embodiment of the present invention. The pattern in which the surface of the unit member is exposed may be designed by being variously modified as a mesh type structure including closed-type opening patterns c1 and c2 as shown in FIGS. 12A and 12B, or a line type including open-type opening patterns c3 and c4 as shown in FIGS. 12C and 12D. As described above, the conductive layers implement an advantage of improving the adhesive strength between the unit members in the unit thermoelectric element formed of the stacked structure of the unit members, reducing the thermal conductivity between the unit members, and improving the electrical conductivity. Thus, as compared with the conventional bulk type thermoelectric element, a cooling capacity Qc and ΔT are improved and, particularly, a power factor is increased 1.5 times, that is, the electrical conductivity is increased 1.5 times. The increase in electrical conductivity is directly related to improvement of thermoelectric efficiency so that cooling efficiency is increased. The conductive layer may be formed of a metal material, and all metal-based electrode materials such as Cu, Ag, Ni, and the like may be applied.

When a unit thermoelectric element having the above-described stacked structure in FIG. 11 is applied to the thermoelectric element shown in FIG. 1, that is, the thermoelectric element according to the embodiment of the present invention is disposed between the lower substrate 140 and the upper substrate 150 and the thermoelectric module is implemented as a unit cell with a structure including an electrode layer, a total thickness Th may be formed in the range of 1 mm to 1.5 mm so that it is possible to implement significant thinness as compared with using the existing bulk-type element.

In addition, the above-described thermoelectric element in FIG. 11 is aligned to be laterally disposed in an upward direction and a downward direction and cut as shown in FIG. 13C so that the thermoelectric element according to the embodiment of the present invention may be implemented.

The structure shown in FIG. 13C may form a thermoelectric element with a structure in which surfaces of an upper substrate, a lower substrate, a semiconductor layer, and a base substrate are disposed adjacent to each other. However, as shown in FIG. 13B, the thermoelectric element also has a structure in which the thermoelectric element is vertically erected to allow a side surface of a unit thermoelectric element to be disposed adjacent to the upper substrate and the lower substrate. In such a structure, as compared with a horizontal arrangement structure, a distal end portion of the conductive layer is exposed on the side surface and it is possible to reduce thermal conductivity efficiency in a vertical direction and, simultaneously, improve an electrical conductivity characteristic so that cooling efficiency may be further increased.

As described above, in the thermoelectric element applied to the thermoelectric module of the present invention, which may be implemented in various examples, shapes and sizes of the P-type thermoelectric legs and the N-type thermoelectric legs facing each other are the same. In this case, in consideration that the electrical conductivity of the P-type thermoelectric leg and the electrical conductivity of the N-type thermoelectric leg are different from each other to act as a factor degrading the cooling efficiency, it is also possible to form a volume of one semiconductor device to be different from that of the other semiconductor device opposite to the one semiconductor device, thereby improving cooling performance.

Hereinafter, a butterfly type laser diode (LD) module to which the thermoelectric element according to the embodiment of the present invention is applied will be described with reference to FIG. 14.

Figure 14:
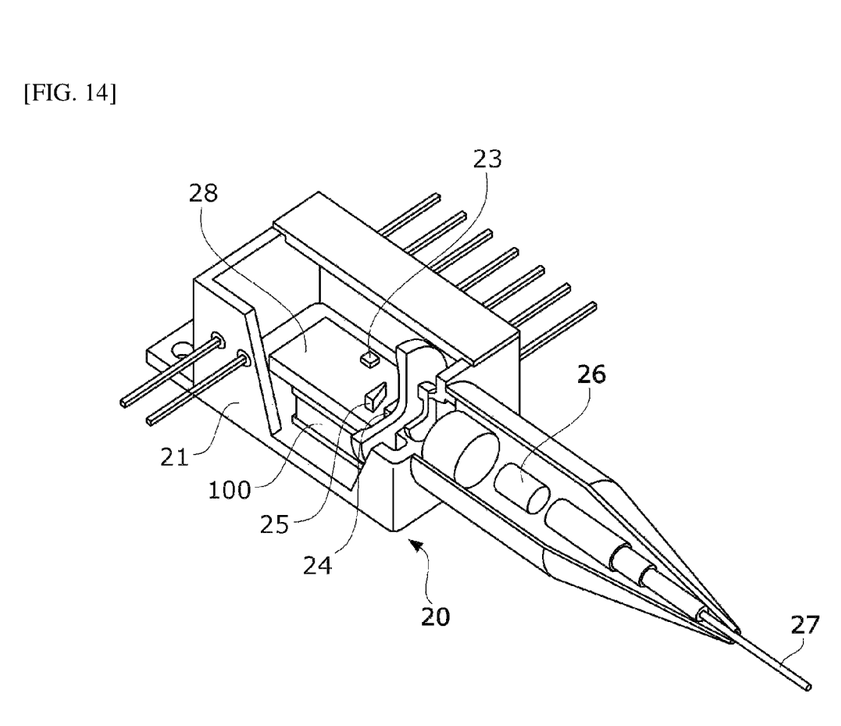
FIG. 14 is a perspective view showing a butterfly type laser diode (LD) module to which the thermoelectric element according to the embodiment of the present invention is applied.

FIG. 14 is a perspective view showing a butterfly type LD module to which the thermoelectric element according to the embodiment of the present invention is applied.

The butterfly type LD module has a function of controlling a temperature.

As shown in FIG. 14, a butterfly type LD module 20 includes a thermoelectric element (TEC) 100 installed in a ceramic package 21, a thermistor 23 which is a temperature sensor, an LD chip 24, and a monitor photodiode (MPD) chip 25.

The LD chip 24 and the MPD chip 25 are installed on the TEC 100. The ceramic package 21 is hermetically sealed. The butterfly type LD module 20 is advantageous to have a function of controlling a bandwidth and a temperature in a wide range.

Light is collected using a lens 26 outside the ceramic package 21 and then aligned to a fiber 27. In the point of view of an alignment method, the butterfly type LD module 20 may also be referred to as a device using an active alignment method.

In the butterfly type LD module 20, a die of the LD chip 24 may be bonded to an upper surface of a metallic plate 28.

While the present invention has been mainly described with reference to the exemplary embodiments, it should be understood that the present invention is not limited to the disclosed exemplary embodiments, and various modifications and applications can be devised by those skilled in the art to which the present invention pertains without departing from the gist of the present invention. For example, each component specifically shown in the exemplary embodiments can be modified and implemented. It should be construed that differences related to these modifications and applications will fall within the scope of the present invention defined by the appended claims.

[Description of Reference Numerals]

| | |
|---|---|
| 120: P-type thermoelectric leg | 130: N-type thermoelectric leg |
| 140: lower substrate | 150: upper substrate |
| 161: lower electrode | 162: upper electrode |
| 170, 270, 370, 370: reinforcement | |

The invention claimed is:

1. A thermoelectric element comprising:
a first substrate;
a thermoelectric leg disposed on the first substrate;
a second substrate disposed on the thermoelectric leg;
a first electrode disposed between the first substrate and the thermoelectric leg;
a second electrode disposed between the second substrate and the thermoelectric leg; and
a first reinforcement disposed on a lower surface and a part of at least one side surface of the first substrate,
wherein the first reinforcement includes:
a lower surface reinforcement disposed on the lower surface of the first substrate; and
a side surface reinforcement extending from the lower surface reinforcement and disposed on the at least one side surface of the first substrate,
wherein the lower surface reinforcement includes:
a first layer disposed on the lower surface of the first substrate;
a second layer disposed on the first layer such that the first layer is between the lower surface of the first substrate and the second layer;
a third layer disposed on the second layer such that the second layer is between the third layer and the first layer, and
wherein the side surface reinforcement is only the first layer which is extended from the first layer of the lower surface reinforcement,
wherein the first layer is a first metal layer disposed on the lower surface and the side surface of the first substrate, and the second layer is a second metal layer disposed on a lower surface of the first metal layer.

2. The thermoelectric element of claim 1, further comprising a second reinforcement disposed on an upper surface and a part of a side surface of the second substrate.

3. The thermoelectric element of claim 1, wherein:
the at least one side surface of the first substrate includes a long side surface and a short side surface; and
a width of the long side surface is less than or equal to a total width of the side surface reinforcement disposed on the long side surface.

4. The thermoelectric element of claim 1, wherein a height of the first reinforcement is 0.2 to 1.5 times a height of the first substrate.

5. The thermoelectric element of claim 1, further comprising a dielectric layer disposed between the first substrate and the first electrode.

6. The thermoelectric element of claim 1, wherein the third layer is a third metal layer disposed on a lower surface of the second metal layer.

7. The thermoelectric element of claim 1, wherein:
the first reinforcement includes an upper surface reinforcement extending from the side surface reinforcement and disposed on an upper surface of the first substrate; and
the upper surface reinforcement is spaced apart from the thermoelectric leg and the first electrode.

8. The thermoelectric element of claim 7, further comprising an insulating member disposed between the upper surface reinforcement and the first electrode.

9. A thermoelectric element comprising:
a first substrate;
a thermoelectric leg disposed on the first substrate;
a second substrate disposed on the thermoelectric leg;
a first electrode disposed between the first substrate and the thermoelectric leg;
a second electrode disposed between the second substrate and the thermoelectric leg; and
a first reinforcement disposed on a lower surface and a part of at least one side surface of the first substrate, wherein the first reinforcement includes:
a lower surface reinforcement disposed on the lower surface of the first substrate; and
a side surface reinforcement extending from the lower surface reinforcement and disposed on the at least one side surface of the first substrate,
wherein the lower surface reinforcement includes:
a first layer disposed on the lower surface of the first substrate;
a second layer disposed on the first layer such that the first layer is between the lower surface of the first substrate and the second layer;
a third layer disposed on the second layer such that the second layer is between the third layer and the first layer, and
wherein the side surface reinforcement is only the first layer which is extended from the first layer of the lower surface reinforcement, wherein:
the at least one side surface of the first substrate includes a short side surface and a long side surface; and
a width of the long side surface is more than or equal to a total width of the side surface reinforcement disposed on the long side surface.

10. The thermoelectric element of claim 9, wherein the first layer is a first metal layer disposed on the lower surface and the side surface of the first substrate, and the second layer is a second metal layer disposed on a lower surface of the first metal layer.

11. The thermoelectric element of claim 10, wherein a width of the first metal layer on the at least one side surface of the first substrate is greater than a thickness of the first metal layer on the lower surface of the first substrate.

12. The thermoelectric element of claim 9, wherein the side surface reinforcement includes:
a first side surface reinforcement disposed in a corner area formed by the short side surface and the long side surface of the first substrate, and
a second side surface reinforcement disposed on the long side surface of the first substrate in a central portion in a width direction.

13. The thermoelectric element of claim 12, wherein the first side surface reinforcement and the second side surface reinforcement are disposed to be spaced apart from each other.

14. The thermoelectric element of claim 13, wherein the first side surface reinforcement includes a first region disposed on the short side surface of the first substrate and a second region extended from each of two terminals of the first region and disposed on the long side surface.

15. The thermoelectric element of claim 13, wherein the first side surface reinforcement is a pair of first side reinforcements that are disposed symmetrically to each other.

16. A thermoelectric element comprising:
a first substrate;
a thermoelectric leg disposed on the first substrate;
a second substrate disposed on the thermoelectric leg;
a first electrode disposed between the first substrate and the thermoelectric leg;
a second electrode disposed between the second substrate and the thermoelectric leg; and
a first reinforcement disposed on a lower surface and a part of at least one side surface of the first substrate, wherein the first reinforcement includes:
a lower surface reinforcement disposed on the lower surface of the first substrate; and
a side surface reinforcement extending from the lower surface reinforcement and disposed on the at least one side surface of the first substrate,
wherein the lower surface reinforcement includes:
a first layer disposed on the lower surface of the first substrate;
a second layer disposed on the first layer such that the first layer is between the lower surface of the first substrate and the second layer;
a third layer disposed on the second layer such that the second layer is between the third layer and the first layer, and
wherein the side surface reinforcement is only the first layer which is extended from the first layer of the lower surface reinforcement, wherein:
the first layer is made of copper;
the second layer is made of nickel; and
the third layer is made of gold.

* * * * *